US010150675B2

(12) United States Patent
Hertlein et al.

(10) Patent No.: US 10,150,675 B2
(45) Date of Patent: Dec. 11, 2018

(54) METHOD FOR PRODUCING POLYCRYSTALLINE SILICON

(71) Applicant: Wacker Chemie AG, Munich (DE)

(72) Inventors: Harald Hertlein, Burghausen (DE); Friedrich Popp, Ooltewah, TN (US)

(73) Assignee: WACKER CHEMIE AG, Munich (DE)

( * ) Notice: Subject to any disclaimer, the term of this patent is extended or adjusted under 35 U.S.C. 154(b) by 27 days.

(21) Appl. No.: 15/116,251

(22) PCT Filed: Jan. 22, 2015

(86) PCT No.: PCT/EP2015/051284
§ 371 (c)(1),
(2) Date: Aug. 3, 2016

(87) PCT Pub. No.: WO2015/113894
PCT Pub. Date: Aug. 6, 2015

(65) Prior Publication Data
US 2017/0001869 A1     Jan. 5, 2017

(30) Foreign Application Priority Data

Feb. 3, 2014  (DE) ................... 10 2014 201 893

(51) Int. Cl.
| | | |
|---|---|---|
| *C01B 33/035* | (2006.01) | |
| *C23C 16/24* | (2006.01) | |
| *C23C 16/44* | (2006.01) | |
| *H01L 21/02* | (2006.01) | |

(52) U.S. Cl.
CPC ............ *C01B 33/035* (2013.01); *C23C 16/24* (2013.01); *C23C 16/4408* (2013.01); *H01L 21/0262* (2013.01); *H01L 21/02532* (2013.01); *H01L 21/02595* (2013.01)

(58) Field of Classification Search
CPC .................................................... C01B 22/035
See application file for complete search history.

(56) References Cited

U.S. PATENT DOCUMENTS

| | | |
|---|---|---|
| 3,328,199 A | 6/1967 | Sirtl |
| 5,352,636 A | 10/1994 | Beinglass |
| 5,895,594 A | 4/1999 | Fuchs |
| 2008/0038178 A1 | 2/2008 | Altmann et al. |
| 2011/0206842 A1* | 8/2011 | Revankar ............ C01B 33/035 427/248.1 |
| 2012/0100302 A1 | 4/2012 | Fabry et al. |
| 2013/0011558 A1 | 1/2013 | Haeckl et al. |
| 2013/0236642 A1 | 9/2013 | Sofin |

FOREIGN PATENT DOCUMENTS

| | | |
|---|---|---|
| DE | 1 202 771 | 10/1965 |
| DE | 1 238 449 B | 4/1967 |
| DE | 27 25 574 A1 | 12/1977 |
| DE | 2854707 C2 | 7/1980 |
| EP | 1 886 971 A1 | 2/2008 |
| EP | 2 077 252 A2 | 7/2009 |
| EP | 2 551 239 A1 | 1/2013 |
| JP | 2003306321 A2 | 10/2003 |

\* cited by examiner

*Primary Examiner* — Joseph A Miller, Jr.
(74) *Attorney, Agent, or Firm* — Brooks Kushman P.C.

(57) ABSTRACT

The native oxide layer on silicon support rods in the Siemens polysilicon production process is removed by heating the rods to a temperature of 1100-1200° C. and contacting the rods with hydrogen at a system pressure of 1.1E5 to 6E6 Pa. Oxide is rapidly removed, reducing overall process time and increasing space time yield. The use of hydrogen, optionally purified from a polysilicon deposition and containing only traces of HCl reduces reactor corrosion and loss of silicon from the support rods.

6 Claims, No Drawings

METHOD FOR PRODUCING POLYCRYSTALLINE SILICON

CROSS REFERENCE TO RELATED APPLICATIONS

This application is the U.S. National Phase of PCT Appln. No. PCT/EP2015/051284 filed Jan. 22, 2015, which claims priority to German Application No. 10 2014 201 893.5 filed Feb. 3, 2014, the disclosures of which are incorporated in their entirety by reference herein.

BACKGROUND OF THE INVENTION

1. Field of the Invention

The invention relates to a process for producing polycrystalline silicon.

2. Description of the Related Art

High-purity polycrystalline silicon (polysilicon) serves as a starting material for production of monocrystalline silicon for semiconductors by the Czochralski (CZ) or zone melting (FZ) process, and for production of mono- or polycrystalline silicon by various pulling and casting processes for production of solar cells for photovoltaics.

Polysilicon is typically produced by means of the Siemens process. This involves introducing a reaction gas comprising one or more silicon-containing components and optionally hydrogen into a reactor comprising support bodies heated by direct passage of current, silicon being deposited in solid form on the support bodies.

Silicon-containing components used are preferably silane ($SiH_4$), monochlorosilane ($SiH_3Cl$), dichlorosilane ($SiH_2Cl_2$), trichlorosilane ($SiHCl_3$), tetrachlorosilane ($SiCl_4$) or mixtures of the substances mentioned.

The Siemens process is typically conducted in a deposition reactor (also called a "Siemens reactor"). In the most commonly used embodiment, the reactor comprises a metallic base plate and a coolable bell jar placed onto the base plate so as to form a reaction space within the bell jar. The base plate is provided with one or more gas inlet orifices and one or more offgas orifices for the departing reaction gases, and with holders which help to hold the support bodies in the reaction space and supply them with electrical current. EP 2 077 252 A2 describes the typical construction of a reactor type used in the production of polysilicon.

Each support body usually consists of two thin filament rods and a bridge which connects generally adjacent rods at their free ends. The filament rods are most commonly manufactured from mono- or polycrystalline silicon; less commonly, metals, alloys or carbon are used. The filament rods are inserted vertically into electrodes present at the reactor base, through which they are connected to the power supply. High-purity polysilicon is deposited on the heated filament rods and the horizontal bridge, as a result of which the diameter thereof increases with time. Once the desired diameter has been attained, the process is stopped by stopping the supply of silicon-containing components.

US 2013/236642 A1 discloses a method for producing polycrystalline silicon rods having a rod diameter of >100 mm, by depositing silicon-containing gas by the Siemens method, wherein the Si rods are contacted with hydrogen at the end of the deposition process during cooling in the reactor, wherein the hydrogen flow rate and/or the hydrogen pressure have to be selected such that the power required for maintaining the deposition temperature at this flow rate and/or pressure is at least 50% of the power at the end of deposition, but not less than 5 kW per 1 m rod length, and the cooled Si rods have, in perpendicular cross section, cracks and/or radial stresses having a size of at least $1\cdot10^{-4}$ $cm^{-1}$.

The Si rods are to be contacted with hydrogen at least up to a rod temperature of 800° C. during the cooling phase. At the same time, the pressure in the reactor is to be between 2 and 30 bar.

The previously discussed process imparts defined cracks and stresses to the polycrystalline silicon rods, and they can be crushed more easily to pieces in later further processing. The examples cited were conducted in a Siemens reactor having 8 rods. The thin rods used were made from ultrapure silicon having a length of 2 m and had a diameter of 5 mm. For the deposition, a mixture of hydrogen and trichlorosilane was used. The temperature of the rods was 1000° C. over the entire deposition period.

The pressure in the reactor was 3 bar. Deposition continued until the rods attained the diameter of 160 mm. The power required at the end of deposition was about 25 kW per 1 m of rod length. For the aftertreatment, the pressure was increased to 10 bar or adjusted to ambient pressure (about 1 bar).

US 2012/100302A1 discloses a method for producing polycrystalline silicon rods by deposition of silicon on at least one thin rod in a reactor, wherein, before the silicon deposition, hydrogen halide at a thin rod temperature of 400-1000° C. is introduced into the reactor containing at least one thin rod and is irradiated with UV light, such that halogen and hydrogen radicals arise, and the volatile halides and hydrides that form are removed from the reactor.

In order to be able to heat the support bodies up to a temperature at which silicon is deposited, they have to be "ignited." There are several known ways of doing this, for example igniting by means of what is called a heating finger (cf. DE2854707 A1) or by means of radiated heat (cf. U.S. Pat. No. 5,895,594 A).

Alternatively, a high voltage is applied to the support body. At the high voltage, after a while, current flows through the silicon support body. The support body ignites. The flow of current leads to heating of the support body, which in turn leads to a reduction in resistance and higher flows of current, and hence better heating.

Before silicon can be deposited on the heated support body, the oxide layer thereon has to be removed.

According to U.S. Pat. No. 3,328,199 A, this can be effected in the course of production of polycrystalline silicon by adding HCl to the reaction mixture (halosilane and hydrogen), and exposing the heated support bodies thereto. This removes the oxide layer, or a layer corresponding to a multiple of the oxide layer thickness. Subsequently, the supply of HCl is reduced or ended. The oxide layer is removed within less than 20 min. The support bodies are heated to 1150° C. The following are present in the gas: 30% HCl, 5% TCS and 65% $H_2$ or 30% HCl, 2% TCS and 68% $H_2$. The gas flow rate is 50-100 l/h (0.05-0.1 $m^3$ (STP)/h).

A disadvantage is that HCl has to be supplied to the reaction mixture in order to completely remove the native oxide within an acceptable time. Without addition of HCl, the oxide removal takes more than 1 hour.

This problem gave rise to the objective of the invention.

SUMMARY OF THE INVENTION

The object of the invention is achieved by a process for producing polycrystalline silicon, in which a reaction gas comprising a silicon-containing component and hydrogen is introduced into a reactor, the reactor comprising at least one support body made from silicon, which is heated by direct passage of current, the silicon-containing component being decomposed and polycrystalline silicon being deposited on the at least one support body, wherein the at least one support body made from silicon has an oxide layer which, prior to commencement of the deposition of polycrystalline silicon on the at least one support body, is removed by heating the at least one support body up to a temperature of 1100-1200° C. and exposing it at a system pressure of 0.1 to 5 barg to an atmosphere comprising hydrogen, by feeding a purge gas comprising hydrogen to the reactor.

Preferably, the system pressure is 0.1 to 1 barg.

Preferably, the purge gas rate based on the reactor volume is 10-25 $m^3$ (STP)/h per $m^3$ of reactor volume, more preferably 14 to 19 $m^3$ (STP)/h per $m^3$ of reactor volume.

Preferably, the purge gas consists of hydrogen having a purity of 99 to 99.9999999% by volume ("fresh hydrogen").

It has been found that, under the conditions specified, the oxide layer can be removed in less than 20 min. It is not necessary to add HCl or HF.

The purge gas for removal of the oxide layer may also comprise minor amounts of HCl, and also $H_xSiCl_{4-x}$ (x=0-3) or $SiH_4$. For example, it would also be possible to use unconsumed hydrogen which is withdrawn as offgas from a reactor for deposition of polycrystalline silicon and purified, and contains small amounts of HCl (0.05% by volume), $SiH_4$ (0.15% by volume) and $H_3SiCl$ (0.1% by volume) as a purge gas.

Surprisingly, at lower pressure, the rate at which the oxide layer is removed increases dramatically. The consumption of hydrogen and energy (energy is required to heat the support bodies) was lowered significantly. The shorter period required for the removal of the oxide layer from the support body lowers the total setup time. The reactor space-time yield thus increases.

The removal of the oxide layer from the support body gives rise to an offgas which is conducted from the reactor to an offgas treatment system, especially an offgas scrubber, or to a condensation apparatus.

The gaseous components of the offgas that remain after the condensation can be sent to an adsorption. Here, hydrogen is separated from any existing other constituents of the gas stream and, for example, sent back to the deposition process. The remaining components can be separated in a further condensation into liquid and gaseous components.

A condensation system offers advantages, since the consumption of hydrogen is 50% lower as a result than when a scrubber is used. Consumed hydrogen is preferably replaced by fresh hydrogen. The disadvantage is that the oxide layer removed with the aid of the hydrogen ends up in the gas circuit as an impurity and hence can adversely affect the product quality of the polycrystalline silicon produced. For this reason, the use of a condensation system is less preferred.

When an offgas scrubber is used, the purge hydrogen, at the outlet of the reactor, is introduced into an offgas scrubber with liquid absorption medium, preferably water, and then released into the free atmosphere. According to official regulations, it is also possible to dispense with an offgas scrubber and to release the offgas directly into the atmosphere.

When a condensation system is used, the offgas (purge hydrogen at the reactor outlet) is cooled over several stages with different cooling media, for example water, brine, Frigen etc., and compressed. Subsequently, the offgas thus cleaned can be fed back to the reactors as a feed gas.

Preferably, the system pressure (0.1-5 barg) at which the support body is exposed to an atmosphere comprising hydrogen is greater than the scrubber pressure and less than the condensation pressure. Preferably, the scrubber pressure is greater than 0.0 barg and less than 0.3 barg. Preferably, the pressure in the condensation is greater than 5.0 barg.

Table 1 shows the modes of operation for two comparative examples (offgas scrubber/condensation) and for inventive examples 1 and 2.

TABLE 1

| Comparative example 1 | Comparative example 2 | Examples 1 (2) |
|---|---|---|
| 3 pressure swings, 3 × 80 $m^3$ (STP)/supply of fresh $H_2$ | 3 pressure swings, 3 × 80 $m^3$ (STP)/supply of fresh $H_2$ | 3 (or 4) pressure swings, 3 × (or 4×) 80 $m^3$ (STP)/supply of fresh $H_2$ |
| Oxide removal for 80 min with 180 $m^3$ (STP)/h $H_2$ Offgas to offgas scrubber | Oxide removal for 80 min with 180 $m^3$ (STP)/h $H_2$ Offgas to condensation | Oxide removal for 12 (6) min with 36 $m^3$ (STP)/h Offgas to offgas scrubber |
| Rod temperature 1100 to 1200° C. | Rod temperature 1100 to 1200° C. | Rod temperature 1100 to 1200° C. |
| Sum total of $H_2$ consumption in oxide removal 240 $m^3$ (STP) | Sum total of $H_2$ consumption in oxide removal 240 $m^3$ (STP) | Sum total of $H_2$ consumption in oxide removal 7 (4) $m^3$ (STP) |
| Sum total of $H_2$ consumption in oxide removal + pressure swing 480 $m^3$ (STP) | Sum total of $H_2$ consumption in oxide removal + pressure swing 240 $m^3$ (STP) | Sum total of $H_2$ consumption in oxide removal + pressure swing 247 (324) $m^3$ (STP) |
| T0 time gain 0 minutes | T0 time gain 0 minutes | T0 time gain 68 minutes = 80 − 12 (80 − 6 − 15 for optional 4th pressure buildup and release) |

The comparative examples show two different modes of operation which are not in accordance with the invention.

Both modes of operation start with 3 pressure swings (pressure release and buildup) with fresh hydrogen.

Starting from a system pressure of about 5.5 bar gauge under a nitrogen atmosphere, with supply of purge hydrogen, the system pressure is lowered to about 0.4 bar gauge and then raised again to 5.5 bar gauge. This cycle takes about 15 minutes and is repeated 3 times.

In both comparative examples, 80 minutes are needed to completely remove the oxide from the rod-shaped support bodies (at 6 barg with a flow rate of 180 $m^3$ (STP)/h of hydrogen, a rod temperature of 1100 to 1200° C.).

The offgas from comparative example 1 is fed to an offgas scrubber. In comparative example 2, a condensation system is used.

In comparative example 2, compared to comparative example 1, there is a saving of 240 $m^3$ (STP)/h of hydrogen.

Otherwise, both comparative examples have the same time requirement and do not lead to any improvement in the batch changeover time or to any reduction in the plant shutdown time (T0).

EXAMPLE 1

Starting from a system pressure of about 5.5 bar gauge under a nitrogen atmosphere, with supply of purge hydrogen, the system pressure is lowered to about 0.4 bar gauge and then raised again to 5.5 bar gauge. This cycle takes about 15 minutes and is repeated 2.5 times. Thus, the system pressure at the end is 0.4 barg.

At a pressure of 0.4 barg with a flow rate of 36 m³ (STP)/h (180 m³ (STP)/h/7 bara*1.4 bara) of hydrogen, a rod temperature of 1100 to 1200° C., the oxide layer has been removed completely after 12 min.

Subsequently, the pressure is increased again to 5.5 barg and hence the 3rd pressure cycle is completed.

EXAMPLE 2

Starting from a system pressure of about 5.5 bar gauge under a nitrogen atmosphere, with supply of purge hydrogen, the system pressure is lowered to about 0.4 bar gauge and then raised again to 5.5 bar gauge. This cycle takes about 15 minutes and is repeated 3.5 times. Thus, the system pressure at the end is 0.4 barg.

In example 2, there is a fourth pressure swing (duration: 15 min).

At a pressure of 0.4 barg, with a flow rate of 36 m³ (STP)/h (180 m³ (STP)/h/7 bara*1.4 bara) of hydrogen, a rod temperature of 1100 to 1200° C., the oxide layer has been removed completely after 6 min.

Subsequently, the pressure is increased again to 5.5 barg and hence the 4th pressure cycle is completed.

Compared to comparative example 1, there is a saving of 233 m³ (STP)/h of fresh hydrogen (example 1) or 176 m³ (STP)/h of fresh hydrogen (example 2) per batch. The time until complete removal of the oxide is reduced from 80 min to 12 min (example 1) or 6 min (example 2).

As a result, the batch changeover time is reduced by 68 min in example 1 and by 59 min in example 2. This is combined with corresponding increases in plant deployment.

The invention claimed is:

1. A process for producing polycrystalline silicon, comprising introducing a reaction gas comprising a silicon-containing component and hydrogen into a reactor having an internal volume, the reactor containing at least one support body made from silicon which is heated by direct passage of current, decomposing the silicon-containing component, thereby depositing polycrystalline silicon on the at least one support body, the at least one support body made from silicon having a surface oxide layer, and prior to commencing deposition of polycrystalline silicon on the at least one support body, removing the surface oxide layer by heating the at least one support body up to a temperature of 1100-1200° C. and exposing the at least one support body to a gas consisting of from 99 to 99.9999999 volume % of hydrogen at a reactor pressure of $1.1 \times 10^5$ Pa to $6 \times 10^5$ Pa, wherein a gas flow rate, based on the reactor internal volume, is 10-25 m³/h per m³ of reactor internal volume, at standard temperature and pressure.

2. The process of claim 1, wherein the system pressure is $1.1 \times 10^5$ to $2 \times 10^5$ Pa.

3. The process of claim 1, wherein a gas rate, based on the reactor volume, is 14 to 19 m³ (STP)/h per m³ of reactor volume.

4. The process of claim 1, wherein the removal of the oxide layer from the at least one support body is effected within less than 20 min and gas is fed in after removal of the oxide layer from the at least one support body has ended.

5. The process of claim 1, wherein the removal of the oxide layer gives rise to an offgas which is fed to an offgas treatment system or a condensation apparatus, the system pressure in the offgas treatment system being less than the reactor pressure during the removal of the oxide layer and the pressure in the condensation apparatus being greater than the reactor pressure during the removal of the oxide layer.

6. The process of claim 1, wherein the gas contains 0.05 volume percent or less of HCl.

* * * * *